(12) United States Patent
Chen et al.

(10) Patent No.: US 11,009,914 B2
(45) Date of Patent: May 18, 2021

(54) ELECTRONIC DEVICE

(71) Applicant: PEGATRON CORPORATION, Taipei (TW)

(72) Inventors: Chien-I Chen, Taipei (TW); Wei-Pang Lee, Taipei (TW); Hsin-Lan Liao, Taipei (TW); Chen-Wei Lai, Taipei (TW); Yi-Lun Tsao, Taipei (TW); Jyun-Yi Lee, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/683,823

(22) Filed: Nov. 14, 2019

(65) Prior Publication Data

US 2020/0225709 A1 Jul. 16, 2020

(30) Foreign Application Priority Data

Jan. 16, 2019 (TW) .................................. 108200765

(51) Int. Cl.
*G06F 1/16* (2006.01)
*H05K 5/02* (2006.01)
*B29C 43/32* (2006.01)

(52) U.S. Cl.
CPC ............ *G06F 1/1656* (2013.01); *B29C 43/32* (2013.01); *G06F 1/1616* (2013.01); *H05K 5/0217* (2013.01)

(58) Field of Classification Search
CPC ..... G06F 1/1656; G06F 1/1616; B29C 43/32; H05K 5/0217
See application file for complete search history.

(56) References Cited

U.S. PATENT DOCUMENTS

| | | | |
|---|---|---|---|
| 2012/0160733 A1* | 6/2012 | Liang .................... | G06F 1/1656 206/586 |
| 2014/0262849 A1* | 9/2014 | Karp .................... | H05K 5/0086 206/37 |
| 2015/0331456 A1* | 11/2015 | Moon ................... | H04M 1/185 361/51 |
| 2016/0212867 A1* | 7/2016 | Denq ................... | H05K 5/0217 |
| 2018/0054903 A1* | 2/2018 | Yamamoto ........... | H05K 5/0008 |

FOREIGN PATENT DOCUMENTS

| | | |
|---|---|---|
| TW | 201228525 A | 7/2012 |
| TW | 201628847 A | 8/2016 |

* cited by examiner

*Primary Examiner* — Rockshana D Chowdhury
(74) *Attorney, Agent, or Firm* — McClure, Qualey & Rodack, LLP

(57) ABSTRACT

An electronic device includes a housing and a buffer component. The housing has a corner portion and two side edges adjacent to the corner portion. The buffer component is embedded in the corner portion and includes a strengthened layer and a buffer layer. The strengthened layer includes an arc-shaped side edge and an embedded portion. The embedded portion is embedded in the corner portion, such that the arc-shaped side edge is aligned with the two side edges. The strengthened layer is a strengthened material structure. The buffer layer is disposed between the strengthened layer and the housing, and the buffer layer is an elastic material structure.

8 Claims, 6 Drawing Sheets

ELECTRONIC DEVICE

CROSS-REFERENCE TO RELATED APPLICATION

This non-provisional application claims priority under 35 U.S.C. § 119(a) to Patent Application No. 108200765 in Taiwan, R.O.C. on Jan. 16, 2019, the entire contents of which are hereby incorporated by reference.

BACKGROUND

Technical Field

The disclosure relates to an electronic device, and in particular, to an electronic device having a buffer structure at a corner of a housing.

Related Art

Traditionally, an electronic device achieves impact resistance and high strength mainly through frame wrapping, in which a buffer reinforcement material is adhered to a periphery of a frame of a casing. For example, a buffer material is coated on a periphery of a housing to absorb impact energy with characteristics of high expansion and high resilience of the buffer material, thereby protecting a body of an electronic device.

However, most buffer materials are non-metallic materials. Relative to a metal casing to be protected, the buffer material has poor texture and appearance, so that consistency of an overall product appearance, and an appearance and texture of a product are affected, thereby impacting a consumer's impression and reducing the consumer's buying inclination. In addition, in the traditional method, an edge of a high-elasticity material is adhered to a periphery of a casing of a product using a backing adhesive or glue. Therefore, a reliability problem such as a backing adhesive failure is likely to be caused at a varied environmental condition.

SUMMARY

In view of this, some embodiments of the present invention provide an electronic device.

An electronic device according to an embodiment of the present invention includes a housing and a buffer component. The housing has a corner portion and two side edges adjacent to the corner portion. The buffer component is embedded in the corner portion and includes a strengthened layer and a buffer layer. The strengthened layer includes an arc-shaped side edge and an embedded portion. The embedded portion is embedded in the corner portion such that the arc-shaped side edge is aligned with the two side edges. The strengthened layer is a strengthened material structure. The buffer layer is disposed between the strengthened layer and the housing, the buffer layer being an elastic material structure.

Therefore, the buffer component embedded in the corner portion can absorb energy of impact on the electronic device, and problems such as an overall weight increase and an product cost increase caused by a replacement of an overall material of the housing with a high-strength material can be avoided. The strengthened layer is made of the following material to be used an appearance face of the buffer component: a material that has similar texture as that of the housing of the product or a material whose appearance is easily to deal with and whose mechanical property is superior to that of the housing of the product. The arc-shaped side edge is aligned with the adjacent side edges to surround the buffer layer, so as to conceal the buffer layer between the housing and the strengthened layer, so that an aesthetic problem that the material of the buffer layer is exposed to the appearance of the housing can be alleviated. In short, through an appearance design and material selection of the buffer component, the designed mechanism is combined with the housing of the product housing, so that the whole housing does not need to be replaced with a high-strength material of an excellent mechanical property. Therefore, the housing is light and a collision is avoided.

The objectives, technical contents and features as well as the effects achieved by the present invention will be more comprehensible from the following detailed descriptions of specific embodiments accompanied with figures.

DETAILED DESCRIPTION

Figure 1:
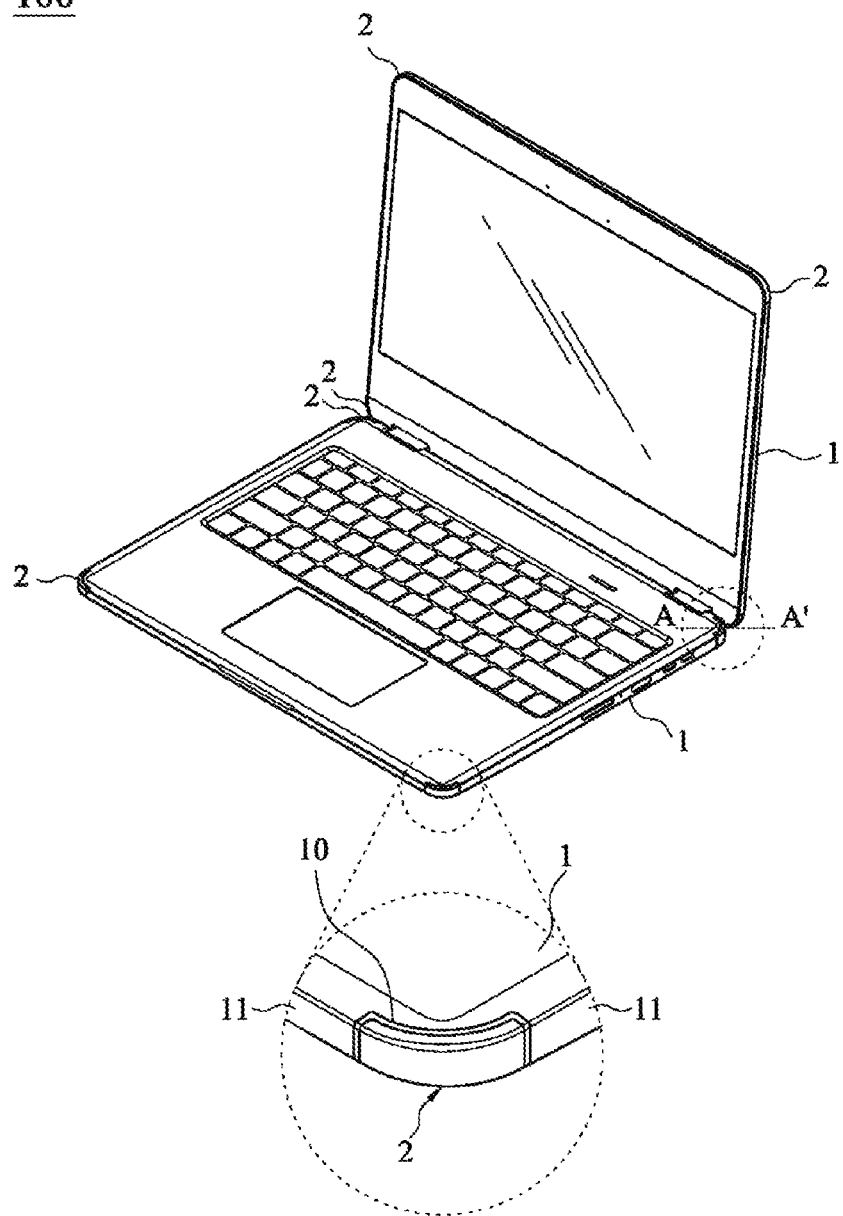
FIG. 1 is a three-dimensional schematic diagram of an electronic device according to an embodiment of the present invention.

Various embodiments of the present invention are described in detail below using the drawings as examples. In the description, a number of specific details are provided for a reader to have relatively complete understanding of the present invention. However, it is possible that the present invention can be implemented with some or all of the specific details omitted. Identical or similar components in the drawings are represented using identical or similar symbols. It should be particularly noted that the drawings are merely for illustrative purposes and do not represent an actual size or number of a component, and some details may not be completely depicted for conciseness of the drawings.

Referring to FIG. 1, FIG. 1 is a three-dimensional schematic diagram of an electronic device 100 according to an embodiment of the present invention. The electronic device 100 includes a housing 1 and a plurality of buffer components 2. In this embodiment, a plurality of buffer components 2 is used as an example. However, in other implementations, one or more buffer components may also be disposed, or a buffer component is disposed at a desired position. The present disclosure is not limited thereto. The housing 1 has a plurality of corner portions 10 and a plurality of side edges 11. Each corner portion 10 is formed by two adjacent side edges 11, that is, the housing 1 has a plurality of corner portions 10 and two side edges 11 adjacent to each corner portion 10. A plurality of buffer components 2 is embedded in a plurality of corner portions 10. In an embodiment, the electronic device 100 may be a notebook computer, a tablet computer, or a mobile device, etc., but the present disclosure is not limited thereto. For example, in this embodiment, the housing 1 has an upper casing and a lower casing for opening and closing. Therefore, the electronic device 100 has eight corner portions 10 in total, and also has eight buffer components 2 in total. In an embodiment, the electronic device 100 may be polygonal. An angle between two adjacent sides 11 may be designed according to requirement, and a buffer component 2 is embedded in the corner portion 10 that is likely to encounter a collision. In this embodiment, the electronic device 100 has a rectangular appearance, and therefore, the two adjacent side edges 11 are perpendicular to each other.

Figure 2:
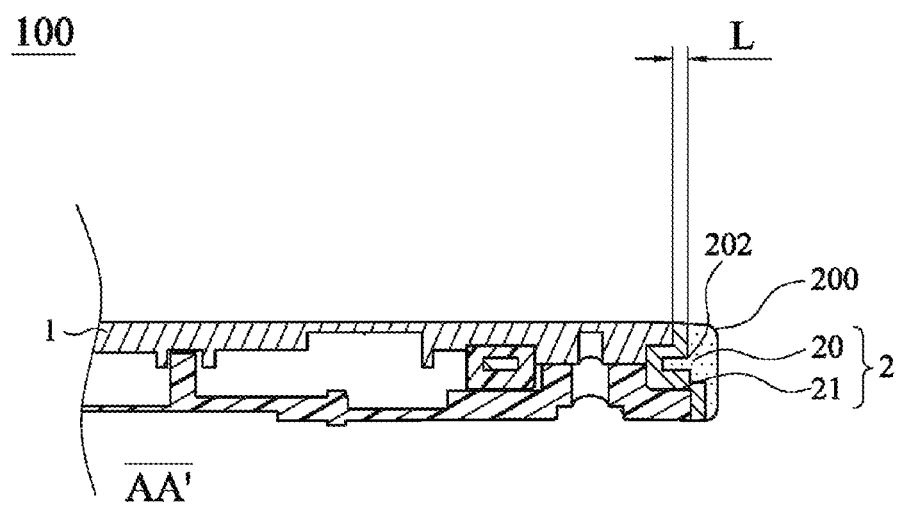
FIG. 2 is a partial schematic enlarged view of an electronic device taken along a section line AA' according to an embodiment of the present invention.
Figure 3:
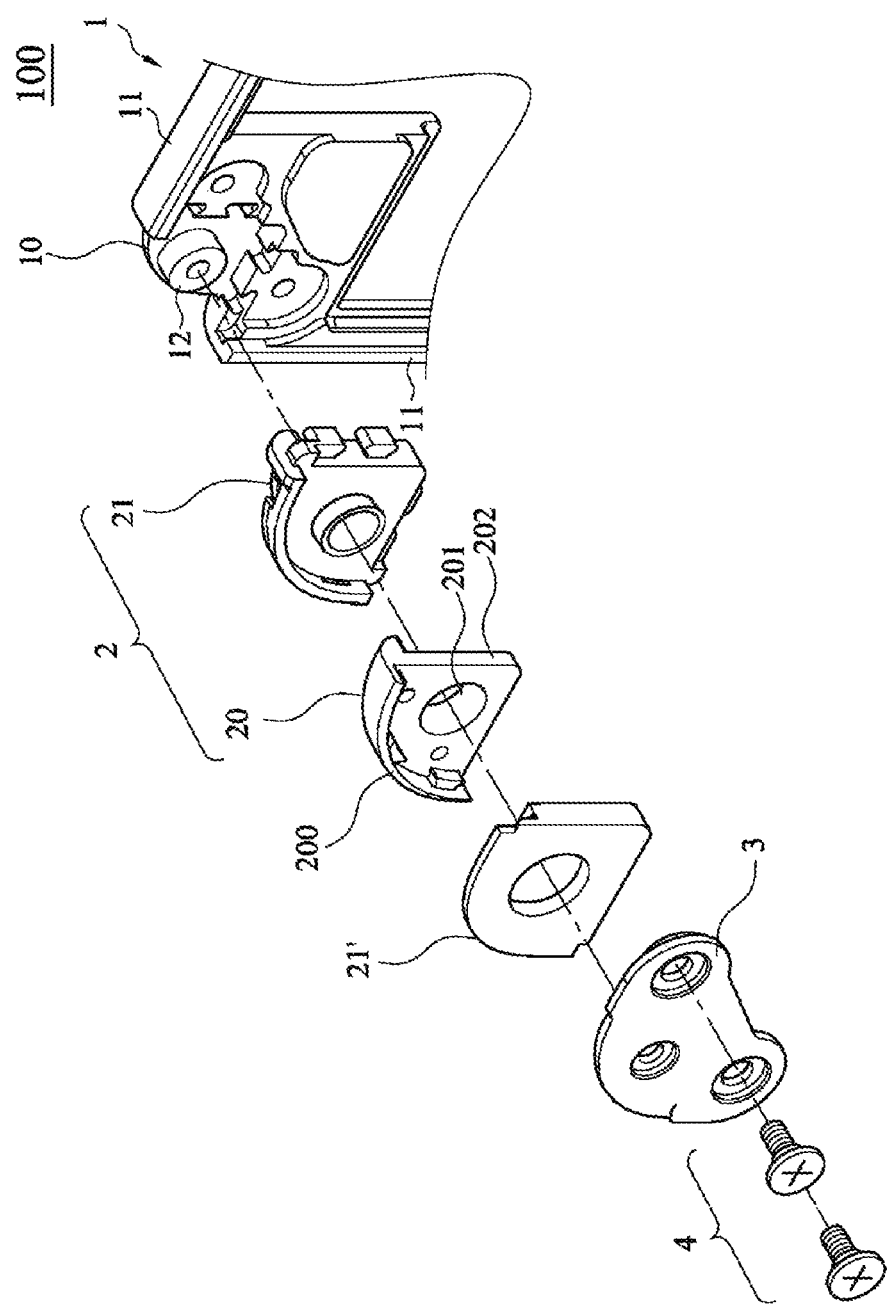
FIG. 3 is a partial schematic exploded view of an electronic device according to an embodiment of the present invention.

Referring to FIG. 1 to FIG. 3 together, FIG. 2 shows a partial schematic enlarged view of an electronic device 100 of FIG. 1 taken along a section line AA', and FIG. 3 is a corresponding partial schematic exploded view. In this embodiment, a buffer component 2 includes a strengthened layer 20 and a buffer layer 21. The buffer layer 21 is disposed between the strengthened layer 20 and the housing 1. In an embodiment, the buffer component 2 is integrated into one body through an injection molding process. The buffer layer 21 is an elastic material structure. In an embodiment, an elastic coefficient of the buffer layer 21 is greater than an elastic coefficient of the housing 1. For example, the buffer layer 21 is a high-elasticity polymer material, including rubber and plastic, but the present disclosure is not limited thereto.

In this embodiment, the strengthened layer 20 includes an arc-shaped side edge 200 and an embedded portion 202. The embedded portion 202 is embedded in the corner portion 10 such that the arc-shaped side edge 200 is aligned with the two side edges 11 to surround the buffer layer 21. In other words, the strengthened layer 20 can be in contact with outside to receive a collision. In this embodiment, the strengthened layer 20 is a strengthened material structure. In an embodiment, a strength coefficient of the strengthened layer 20 is greater than a strength coefficient of the housing 1. For example, the strengthened layer 20 includes a metal material such as titanium, aluminum, and liquid metal, etc., but the disclosure is not limited thereto.

In this embodiment, viewed from the outside of the electronic device 100, only a portion of the buffer layer 21 is exposed between the strengthened layer 20 and the housing 1. Most of the buffer layer 21 is concealed between the housing 1 and the strengthened layer 20, which is shown in FIG. 2.

In order to ensure that impact energy is indeed transmitted to and absorbed by the buffer layer 21, and to avoid deformation of the housing 1 as a result of a direct collision between the strengthened layer 20 and the housing 1, in this embodiment, a distance L between the strengthened layer 20 and the housing 1 is greater than a minimum thickness of the buffer layer 21 after being compressed. In other words, through analyzing of an impact compression amount of a material of the buffer layer 21, the distance L between the arc-shaped side edge 200 of the strengthened layer 20 and the housing 1 is reserved, in which the distance L is larger than the minimum thickness of the compressed buffer layer 21. In addition, the distance L is used as a buffer region.

According to the above structure, a corner portion 10 of the housing 1 of the electronic device 100 having a weaker strength in the drop test is replaced with an impact resistance buffer component 2. The buffer component 2 embedded in the corner portion 10 can absorb energy of impact on the electronic device 100, and problems such as an overall weight increase and a product cost increase caused by a replacement of an overall material of the housing 1 with a high-strength material can be avoided. The strengthened layer 20 is made of the following material to be used an appearance face of the buffer component 2: a material that has similar texture as that of the housing 1 of the product or a material whose appearance is easily to deal with and whose mechanical property is superior to that of the housing 1 of the product. The arc-shaped side edge 200 is aligned with the adjacent side edges 11 to surround the buffer layer 21, so as to conceal the buffer layer between the housing 1 and the strengthened layer, so that an aesthetic problem that the material of the buffer layer 21 is exposed to the appearance of the housing 1 can be alleviated. Moreover, since the buffer layer 21 is an elastic material structure, the buffer layer is flexible under an external force, for example, but not limited to, five to ten times of the giant deformation, so that an overall structural feature of the buffer component 2 can be affected or changed, thereby protecting the housing 1. Overall, the designed mechanism is combined with the housing 1 of the product through an appearance design and material selection for the buffer component 2. Compared to a traditional buffer structure, a reliability risk of a combination of various parts generated when a backing adhesive is used to adhere a buffer material can be avoided. In addition, a whole casing does not need to be replaced with a high-strength material of an excellent mechanical property, and therefore a whole machine is not relatively heavy as a result of an increase in a material density.

A structure of a buffer component according to a related derivative embodiment is exemplified below. Referring to FIG. 3, in this embodiment, the housing 1 has a positioning rod 12, in which the positioning rod 12 extends in a direction perpendicular to a plane in which the housing 1 is located. The strengthened layer 20 has a positioning hole 201 corresponding to the positioning rod 12, and the positioning rod 12 of the housing 1 passes through the positioning hole 201 of the strengthened layer 20, that is, the positioning hole 201 is sleeved on the positioning rod 12. The buffer layer 21 extends between the positioning hole 201 and the positioning rod 12, to avoid a direct collision between the strengthened layer 20 and the housing 1. Therefore, when the strengthened layer 20 is impacted, the buffer layer 21 can absorb and disperse energy of impact, to prevent the housing 1 from being deformed as a result of the impact from the high-strength strengthened layer 20.

In this embodiment, the electronic device 100 further includes an inner plate 3. The buffer component 2 further includes another buffer layer 21' located on a side surface of the strengthened layer 20 relative to the buffer layer 21, and the inner plate 3 covers the another buffer layer 21' to be fixed to the housing. In other words, the buffer component 2 is designed to be a sandwich structure, in which the two buffer layers 21 and 21' are disposed on two opposite left and right side surfaces of the strengthened layer 20, so as to ensure that the buffer material can absorb impact, thereby preventing the housing 1 from being deformed as a result of a direct collision between the strengthened layer 20 and the housing 1.

In this embodiment, the electronic device 100 further includes a plurality of binding components, for example but not limited to, locking screws 4. Each locking screw 4 sequentially passes through the inner plate 3, the another buffer layer 21', the strengthened layer 20, and the buffer layer 21 to be locked to the housing 1. For example, the electronic device 100 has two locking screws 4 disposed on a periphery of the inner plate 3 to fixing the buffer layer 21 between the strengthened layer 20 and the corner portion 10 and lock the strengthened layer 20 on the housing 1. Therefore, the buffer component 2 can be stably embedded in the corner portion 10.

Figure 4:
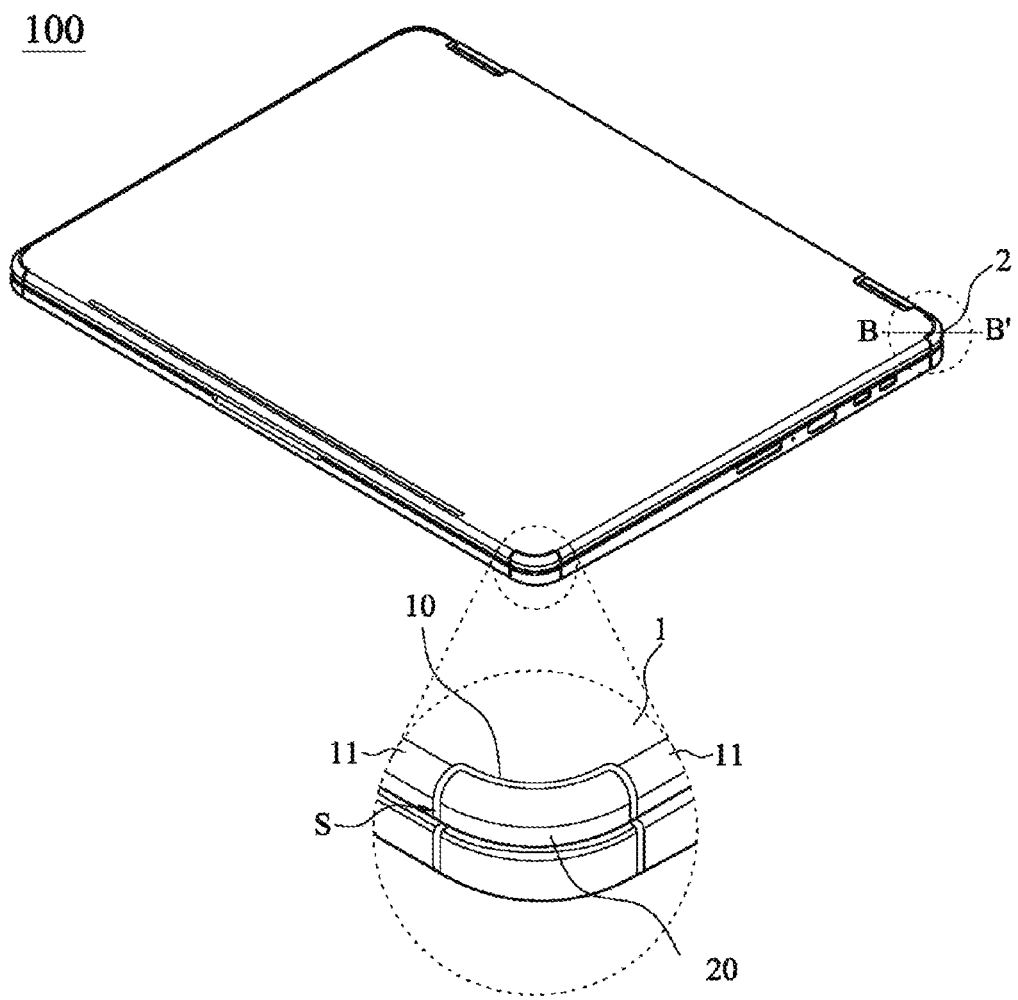
FIG. 4 is a three-dimensional schematic diagram of an electronic device according to an embodiment of the present invention.
Figure 5:
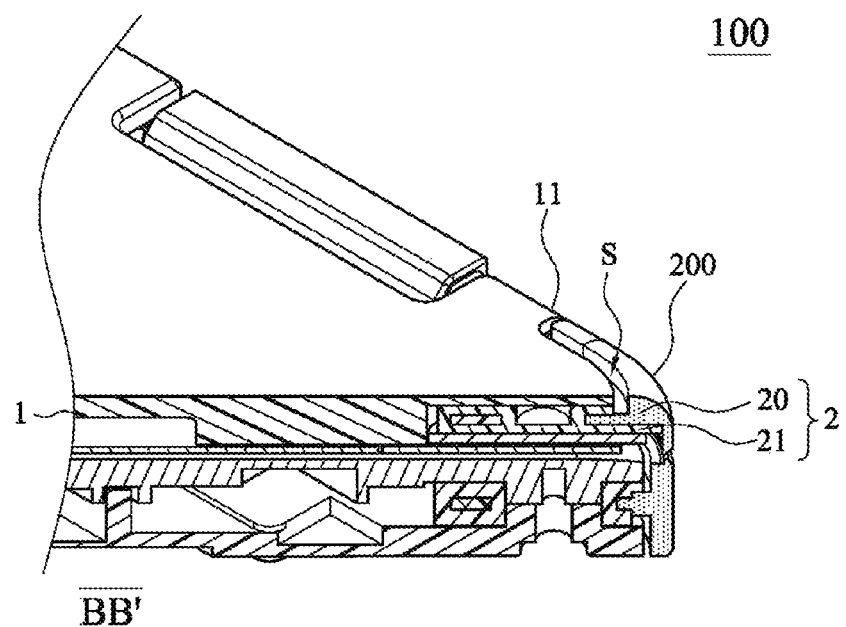
FIG. 5 is a partial schematic enlarged view of an electronic device taken along a section line BB' according to an embodiment of the present invention.

Referring to FIG. 4 and FIG. 5 together, the electronic device 100 of the present embodiment is different from those of the embodiments shown in FIG. 1 and FIG. 2 in that the arc-shaped side edge 200 of the strengthened layer 20 and the two side edges 11 of the housing 1 are spatially separated from each other to form a gap S. The material of the buffer layer 21 is not exposed to the gap S, and the gap S is used as a buffer region for the buffer component 2 to be impacted. In this embodiment, the gap S is an arc-shaped groove. Therefore, distances between the gap S and the arc-shape sides 200 are substantially the same to isolate the buffer component 2 and the housing 1. Viewed from the outside of the electronic device 100, the material of the buffer layer 21 is invisible, that is, the buffer layer 21 is completely concealed between the housing 1 and the strengthened layer 20, thereby avoiding an aesthetic problem that the high-elasticity material of the buffer layer 21 is exposed to an appearance of the housing 1 and problems such as material variation caused when the high-elastic material is exposed to an outside environment. For details of a member feature, a link relationship, and an advantage and effect of the strengthened layer 20, refer to the above.

Figure 6:
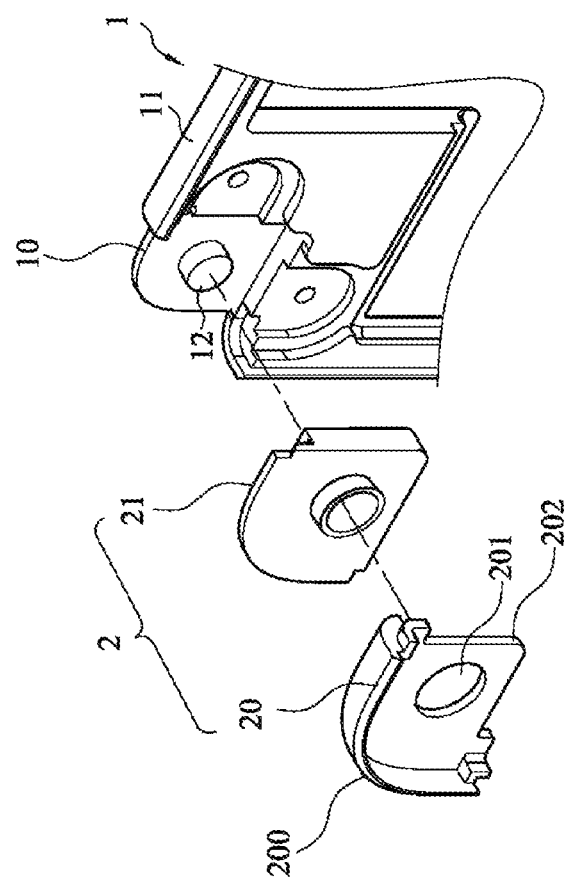
FIG. 6 is a partial schematic exploded view of an electronic device according to an embodiment of the present invention.

Referring to FIG. 5 and FIG. 6, the electronic device 100 of this embodiment is different from that of the embodiment shown in FIG. 3 in that the buffer layer 21 is not exposed in the gap S formed by the strengthened layer 20 and the housing 1, and the gap S is used as a buffer region for the buffer component 2 to be impacted. In other words, the buffer component 2 of this embodiment has a sandwich structure with both a buffer function and a beautiful design. Specific technical feature, link relationship, and advantage and effect of a remaining member are as described above.

In summary, some embodiments of the present invention provide an electronic device, in which a designed mechanism is combined with a housing of the product mainly using a plurality of buffer components embedded in a corner portion of the electronic device, which is likely to encounter a collision, through an appearance design and material selection for the buffer component. Compared to the traditional buffer structure, a reliability risk of a combination of various parts generated when a backing adhesive is used to adhere a buffer material and problems such as material variation or a backing adhesive failure caused when a high elasticity material is exposed to an outside environment can be avoided. In addition, the strengthened layer is made of the following material to be used an appearance face of the buffer component: a material that has similar texture as that of the housing of the product or a material whose appearance is easily to deal with and whose mechanical property is superior to that of the housing of the product. Most of the buffer layer is concealed between the housing and the strengthened layer, so that an aesthetic problem that the material of the buffer layer is exposed to the appearance of the housing can be alleviated.

The embodiments described above are merely used for explaining the technical ideas and features of the present invention, so that persons skilled in the art can learn the contents of the present invention and implement the present invention accordingly. It should be appreciated that the embodiments are not intended to limit the scope of the present invention, and any equivalent variation or modification made without departing from the spirit of the present invention shall fall within the scope of the present invention.

What is claimed is:

1. An electronic device, comprising:
    a housing having a corner portion and two side edges adjacent to the corner portion;
    a buffer component embedded in the corner portion, the buffer component comprising:
        a strengthened layer comprising an arc-shaped side edge and an embedded portion, wherein the arc-shaped side edge is connected to the embedded portion, the embedded portion is embedded in the corner portion such that the arc-shaped side edge exposing from the housing covers the corner portion and is aligned with the two side edges, and the strengthened layer is a strengthened material structure;
        a buffer layer disposed between the strengthened layer and the housing along a direction perpendicular to a plane in which the housing is located, and separating the strengthened layer from the housing, wherein the buffer layer is an elastic material structure; and
        another buffer layer, the buffer layer and the another buffer layer are respectively disposed on two opposite side surfaces of the strengthened layer;
    wherein a distance between the strengthened layer and the housing is greater than a minimum thickness of the buffer layer after being compressed.

2. The electronic device according to claim 1, wherein the buffer component further comprises an inner plate, the inner plate is disposed on a side surface of the another buffer layer relative to the strengthened layer and is configured to fix the buffer component to the housing.

3. The electronic device according to claim 2, wherein the buffer component further comprises at least one locking screw, the at least one locking screw sequentially passes through the inner plate, the another buffer layer, and the strengthened layer to be locked to the housing.

4. The electronic device according to claim 1, wherein the housing has a positioning rod extending in the direction perpendicular to the plane, the strengthened layer has a positioning hole correspondingly sleeved on the positioning rod, and the buffering layer extends between the positioning hole and the positioning rod.

5. The electronic device according to claim 1, wherein the arc-shaped side edge of the strengthened layer and the two side edges of the housing are spatially separated from each other to form a gap.

6. The electronic device according to claim 1, wherein a strength coefficient of the strengthened layer is greater than a strength coefficient of the housing, and an elastic coefficient of the buffer layer is greater than an elastic coefficient of the housing.

7. The electronic device according to claim 1, wherein the strengthened layer comprises titanium, aluminum, and a liquid metal.

8. The electronic device according to claim 1, wherein the buffer layer comprises rubber and plastic.

* * * * *